United States Patent
Estrada

[19]

[11] Patent Number: 6,060,683
[45] Date of Patent: May 9, 2000

[54] SELECTIVE LASER REMOVAL OF DIELECTRIC COATING

[75] Inventor: Calixto Estrada, Bear, Del.

[73] Assignee: Direct Radiography Corp., Newark, Del.

[21] Appl. No.: 09/157,987

[22] Filed: Sep. 22, 1998

[51] Int. Cl.[7] .................................................. B23K 26/00
[52] U.S. Cl. .............................. 219/121.69; 219/121.83
[58] Field of Search .................. 219/121.68, 121.69, 219/121.85, 121.83, 121.67, 121.72; 264/400; 427/554, 555

[56] References Cited

U.S. PATENT DOCUMENTS

| | | | |
|---|---|---|---|
| 5,099,101 | 3/1992 | Millerick et al. | 219/121.67 |
| 5,381,014 | 1/1995 | Jeromin et al. | 250/370.09 |
| 5,648,660 | 7/1997 | Lee et al. | 250/370.09 |
| 5,961,860 | 10/1999 | Lu et al. | 219/121.69 |

*Primary Examiner*—Geoffrey S. Evans
*Attorney, Agent, or Firm*—Ratner & Prestia

[57] ABSTRACT

A process for selectively removing a dielectric layer from a portion of a panel to create a coated and an uncoated region, the process including (a) applying a laser-termination bead on the panel to separate a first region corresponding to the coated region from a second region corresponding to the uncoated region; (b) applying a dielectric coating over the panel and the laser-termination bead; (c) cutting the dielectric layer along the laser-termination bead with a laser beam; and (d) peeling away the dielectric layer from the second region. The panel may be a direct radiography panel; the dielectric layer may be a polymer such as parylene; the laser-termination bead may be an epoxy; and/or the laser may be an excimer laser.

18 Claims, 4 Drawing Sheets

SELECTIVE LASER REMOVAL OF DIELECTRIC COATING

TECHNICAL FIELD

This invention relates to the manufacture of electronic panels, and specifically the manufacture of direct radiography panels having an interlayer dielectric, portions of which must be selectively removed.

BACKGROUND OF THE INVENTION

The selective deposition and removal of dielectric layers on and from portions of a substrate which includes a plurality of electronic components some of which are desired to be covered by the dielectric layer and some of which are not, presents great difficulties when the nature of dielectric material, the underlying layer, and the associated electronic components do not permit using the usual masking and etching techniques for the selective application and removal of the dielectric.

As a specific example of one such application where traditional techniques are not easy to use is in the manufacture of large scale radiation detection panels for use in medical radiography, such as described in U.S. Pat. No. 5,381,014 issued to L. Jeromin et al and assigned to the assignee of the present application, or to U.S. patent application Ser. No. 08/987,485 filed Dec. 9, 1997 entitled "Image capture element", also assigned to the assignee of the present invention. The contents of both are incorporated herein.

As disclosed in these two references, in the manufacture of a radiographic imaging panel such as disclosed therein, there is required to deposit a dielectric layer over the selenium photodetector layer which is substantially coextensive therewith. Such dielectric layer does not extend over portions of the panel along the edges thereof where other electronic components will eventually be connected to leads leading to the access lines and switching transistors associated with the individual radiation detectors in the imaging panel.

In the specific application discussed above, the specifications for the dielectric material, such as dielectric strength and physical properties, typically require a material which is hard to cut and remove along desired lines following its application. Typical such dielectric materials are inter alia, polypropylene, polyethylene terephthalate and parylene. The first two are provided in preformed sheet material which is applied and adhered onto the selenium surface. Because the material is very thin, it is difficult to apply without wrinkles. Parylene on the other hand may be deposited through vacuum deposition at low temperature on the selenium layer. Such process is well known, it is easy to control and yields a smooth coating over the panel surface. Parylene forms a tough layer which even though remains somewhat flexible after polymerization, is even harder to cut with a mechanical instrument than polyethylene terephthalate.

When parylene is used, prior to the parylene-coating step, masking tape has been used to mask the areas, such as the wirebonding pads, where coating is not desired. The resulting parylene and tape thereunder are then manually cut from the rest of the parylene layer with a razor blade. Because the dimensions of the electronic components are extremely small, such cutting is done under a microscope to assure that only the desired areas are removed. After cutting, the portion slated for removal is peeled away with the tape.

This delicate and tedious task can take a substantial amount of time and must be performed by a skilled individual. For example, a medical radiographic application panel has X and Y dimensions of 14 and 17 inches respectively, resulting in a 62 inch perimeter. Typically such panel will have a plurality of electronic components attached along all four sides which will be connected to contact pads on leads extending from under the dielectric layer. (See for instance FIG. 1). These contact pads must not be covered with the dielectric material. Applying a tape along the perimeter to cover the pads prior to the deposition of the dielectric layer and depositing a layer of parylene dielectric material thereover is simple. However, the subsequent cutting of the parylene layer along the masked edge under the microscope with a razor blade may take up to 1-½ hours. Furthermore, the mechanical cutting process exerts a compression force upon the layers of parylene, occasionally causing de-lamination at various interfaces.

There is still, therefore, need to provide a precise, preferably non-contacting process for selectively removing portions of a dielectric coating such as parylene from selected areas of a substrate more quickly and with less risk of damaging the remaining coating, than by a manual cutting operation.

SUMMARY OF THE INVENTION

In accordance with this invention, there is provided a process for selectively removing a dielectric coating from a portion of a panel to create a coated and an uncoated region, the process comprising:

a) applying a laser-termination bead on the panel to separate a first region corresponding to the coated region from a second region corresponding to the uncoated region;

b) applying a continuous dielectric layer over both regions of the panel and over the laser-termination bead;

c) cutting the dielectric layer along the laser-termination bead by traversing the dielectric layer on the laser-termination bead with a laser beam; and d) removing the dielectric layer from over the second region.

The dielectric layer may be a polymer such as parylene. An excimer laser is used for the cutting step. The laser beam may be configured with enough energy to penetrate 125% of the polymer coating thickness.

More particularly, the process may comprise selectively removing a dielectric layer from a desired region of a direct radiography radiation detection panel having a plurality of radiation sensors, and a radiation-detection layer thereover, said desired region having an edge, the process comprising:

(a) applying a laser-termination bead comprising an epoxy along said edge to separate the desired region from the remaining panel, and allowing the epoxy bead to cure;

(b) applying a masking tape along said edge over at least a portion of the desired region;

(c) applying a first dielectric layer over the panel, including over the radiation-detecting layer, the laser-termination bead, and the desired region;

(d) depositing a conductive layer which may be a metal layer transparent to the radiation desired to be detected over the first dielectric layer only in an area that is above the sensors;

(e) applying a second dielectric layer over the chrome layer, the laser-termination bead, and the desired region;

(f) aligning the laser-termination bead along a cutting path by traversing a non-cutting laser beam along the cutting path and observing a trace of the non-cutting laser beam on the laser-termination bead;

(g) simultaneously cutting the first and second dielectric layers along the cutting path by traversing a cutting laser beam along the cutting path; and (h) peeling away the masking tape, thus simultaneously removing the first and second dielectric layers from over the desired areas along with the tape.

DETAILED DESCRIPTION OF THE INVENTION

The invention will next be illustrated with reference to the figures wherein similar numbers indicate the same elements in all figures. Such figures are intended to be illustrative rather than limiting and are included herewith to facilitate the explanation of the apparatus of the present invention. The invention will also be illustrated using a radiation detection panel which employs the type of sensor disclosed in the aforementioned pending application 08/987,485.

While this invention will be described with reference to a specific radiation detection panel, it is understood that it is equally applicable to any instance wherein an electronic panel is coated with a continuous dielectric layer and portions of the panel are desired to ultimately remain uncoated.

Figure 1:
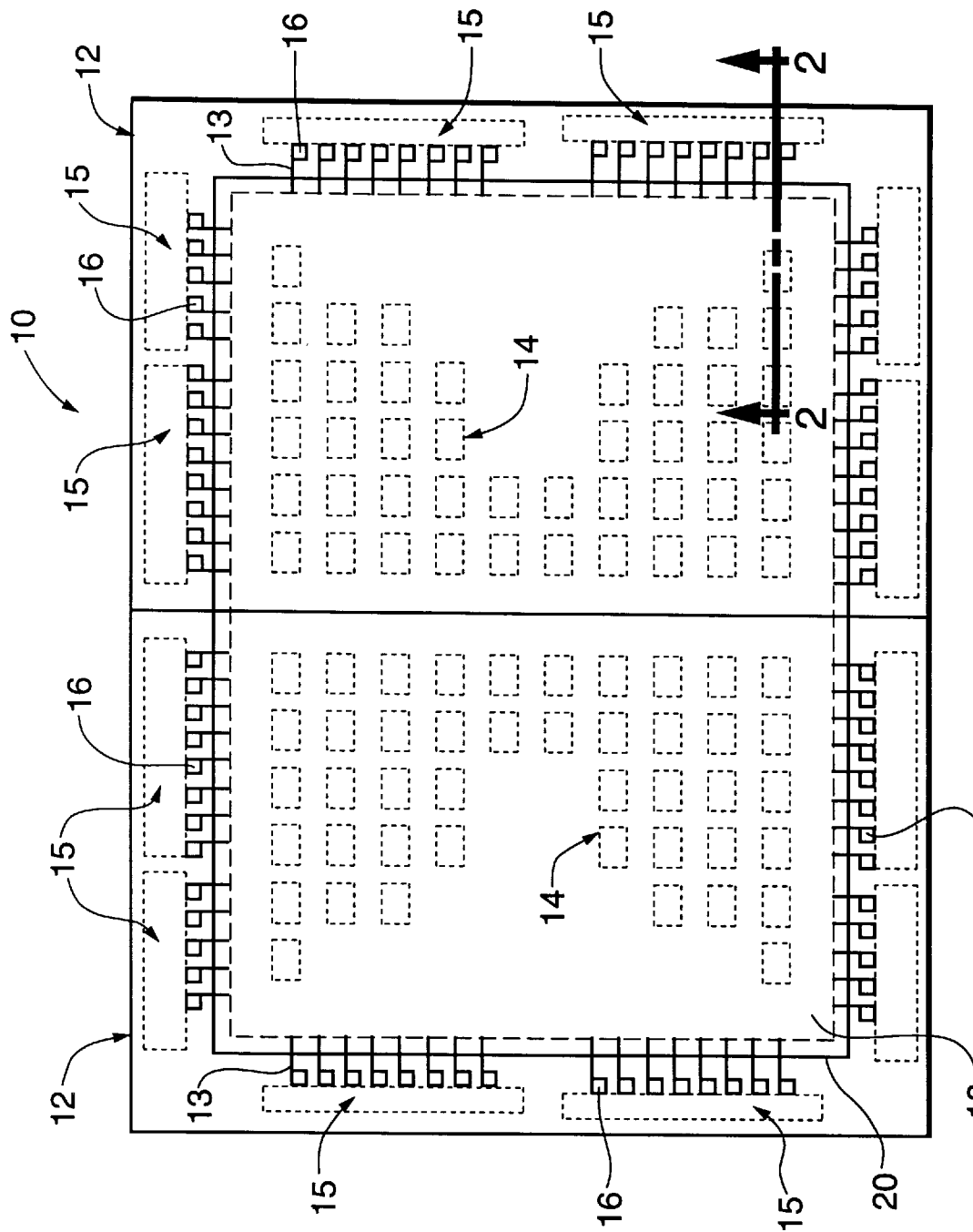
FIG. 1 is a schematic top view illustration of a desired imaging panel having areas in which the dielectric coating is left in place and areas where it has been removed.

Referring now to FIG. 1, there is shown a large electronic panel 10, specifically a large-size radiation detection image capture panel capable of converting a pattern of imagewise modulated radiation into a plurality of electrical charges representative of the imagewise modulated radiation. Two submodules 12 are shown contiguously positioned to form the larger image capture panel 10. Each submodule contains an array of radiation sensors 14, each sensor comprising a switching transistor, typically a thin film field effect transistor, and a charge storage capacitor. Only a limited number of sensors are illustrated to prevent clutter of the figure.

In addition to the sensor array, electronic addressing chips and electronic charge measuring chips (not shown in the figure) are preferably provided on each submodule 12. The chips are mounted along the panel edge at a location 15 shown in dotted lines in the figure. These chips are wired to wirebonding pads 16 for addressing the individual sensors 14 through leads 13 that terminate at wirebonding pads 16. The chips are usually electrically connected to a central control unit (also not shown). The control unit enables sequential electronic access to the sensors 14. The charge measuring chips are typically connected to a multiplexing submodule (not shown) that is also connected to the central control unit. The central control unit therefore provides control signals to the sensors 14 and receives electronic signals indicative of the strength of an incident imagewise-modulated X-ray pattern from each of the sensors. A more detailed description of the operation of a radiation detection sensor of this type will be found in U.S. Pat. No. 5,648,660 issued to Lee et al. and assigned to Sterling Diagnostic Imaging Inc.

A continuous photoconductive layer 18 extends over the assembled panels 12 and the array 14, but not over the wirebonding pads 16. A transparent dielectric layer 20 which is preferably a layer of parylene, extends over the photoconductive layer 18. The dielectric layer also does not cover the wirebonding pads 16.

Figure 2:
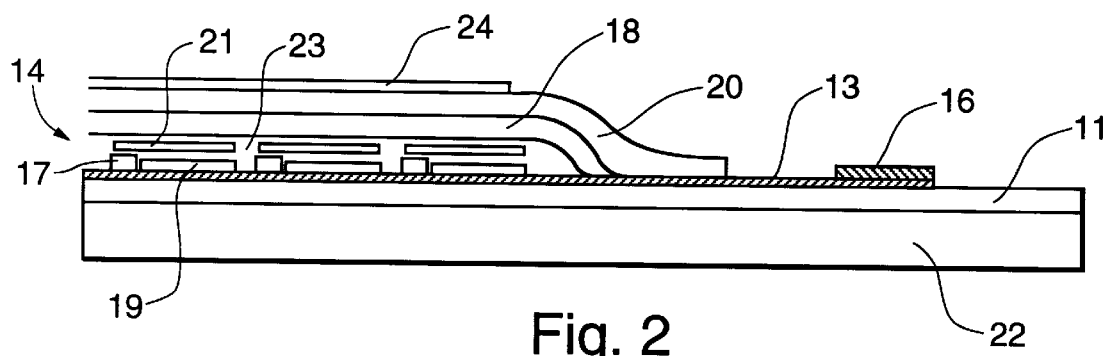
FIG. 2 is a schematic sectional view illustration of the panel of FIG. 1 taken along arrows 2—2.

Referring now to FIG. 2, there is shown a cross-sectional schematic illustration of a portion of radiation-detection panel 10 taken across arrows 2—2 in FIG. 1. As shown in FIG. 2, the array submodules 12 comprise a dielectric substrate 11 which supports the array of sensors 14. Briefly, the sensors each comprise switching transistor 17 and an associated storage capacitor formed by two microplates 19 and 21. A dielectric layer 23 insulates the microplates and separates the capacitor and switching transistor from photoconductive layer 18 which in the structure used for this illustration, is a layer of amorphous selenium. Under the same dielectric layer 23, run conductive lines 13 connecting the switching transistor to wirebonding pads 16 along the panel edges. The individual panels 12 are mounted on a supporting base 22 to form the large size panel 10. Preferably, dielectric layer 23, substrate 11 and base 22 are all transparent to visible radiation.

Figure 4:
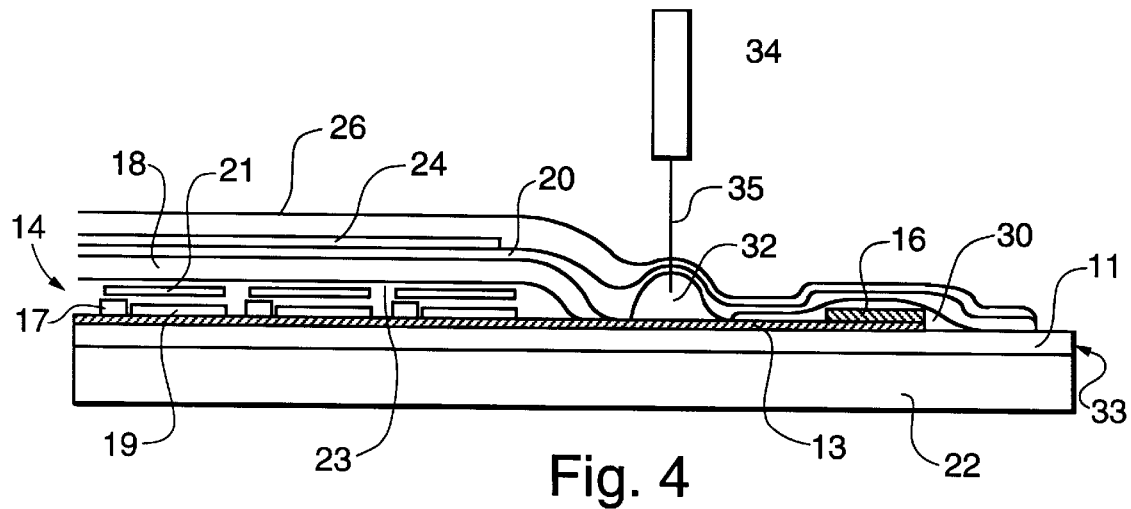
FIG. 4 is a schematic sectional view illustration of the panel of FIG. 3 taken along arrows 4—4.
Figure 3:
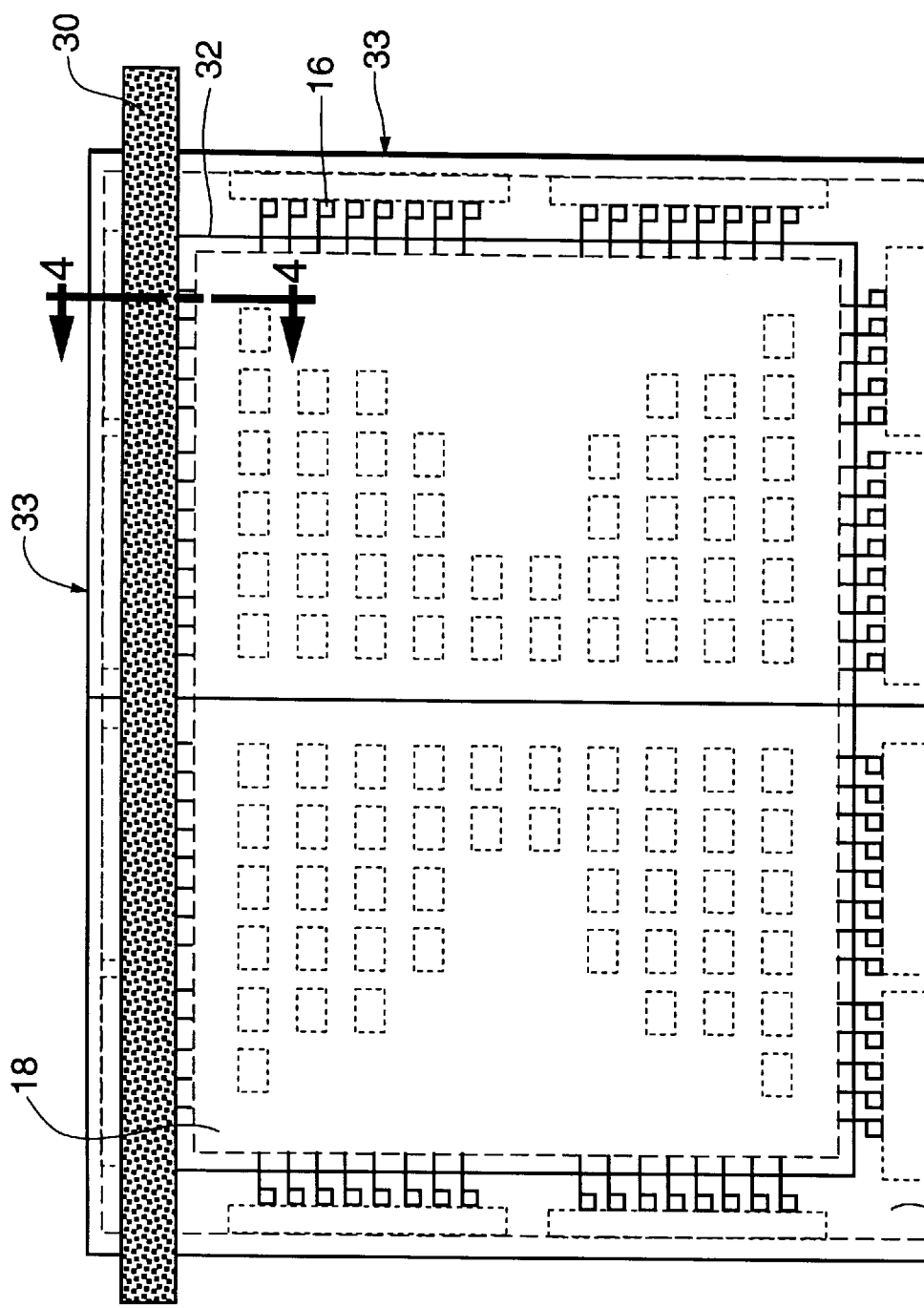
FIG. 3 shows a schematic top view of a panel such as the panel of FIG. 1 following the deposition of a termination bead, masking tape, and dielectric layer but prior to removal of the dielectric layer from the selected areas.

Over the dielectric layer 23, there is deposited a radiation-detection layer 18, which is a photoconductive layer, preferably Selenium. A top dielectric layer 20 which is transparent to X-ray radiation and also preferably to visible radiation such as a parylene layer, is deposited over the photoconductive layer. As shown in FIGS. 1 and 2 this layer 20 does not extend over wirebonding pads 16 but terminates in the space between the wirebonding pads 16 and the edge of the photoconductive layer 18. A conductive layer 24 is usually deposited over the top dielectric layer 20. Optionally, as shown in FIGS. 3 and 4, a second top dielectric layer 26 may be placed over the conductive layer 24. It is recognized that the above description of a large size detector is somewhat simplified, however the technology for producing radiation detection panels containing large FET arrays and associated electrodes as well as radiation detection layers is well known in the art.

The deposition of a parylene dielectric layer, a highly desirable material for use as a dielectric in this type of radiation sensor, entails the evaporation of the dimer 2(Para-xylylene) by heating to 150° C. at 0.1 torr pressure in a vacuum deposition apparatus. The vaporized dimer condenses on the photoconductor surface as a film layer of poly(para-xylylene) which is commonly known as "parylene". Typically the dielectric layer 20 will have a thickness of about 40$\mu$, and the optional second dielectric layer 26 which may again be parylene has a thickness of about 80$\mu$.

Because each parylene layer is vacuum-deposited, it is most convenient to coat the entire panel, and then remove the coating from the designated areas of the panel where the coating is not desired, such as over wirebonding pads 16. To protect the wirebonding pads from being coated, a layer of masking tape 30 is placed over the wirebonding pads, as shown in FIG. 3. (The tape is shown only along one side of the panel to avoid clutter in the figure.) In the past, this tape was removed after manually cutting the parylene with a razor blade under a microscope along the outline of the designated area, and then peeling away the tape. The present invention comprises using a laser beam to cut the parylene.

Parylene is transparent to visible light, but readily absorbs ultraviolet light below 300 nm. An excimer laser, integrated with a large-format precision positioning and targeting system that enables automation, provides a precise, non-contact tool for cutting parylene.

The use of a laser beam to cut through the parylene layer, however, presents the following problem. In order to completely cut the parylene layer the laser beam must fully penetrate the parylene layer and only the parylene layer since further penetration will damage the electronic components under the layer, such as the conductive lines leading to the sensors. Even with careful control of laser focusing and exposure, excess laser energy may reach beyond the parylene layer limits and may damage sensitive areas below the parylene.

To prevent such damage, there is provided according to this invention a laser-termination bead 32 between the edge of the selenium coating and the wirebonding pads. This laser-termination bead 32 is intended to be situated under the path of the cutting laser during the cutting step as shown in FIG. 4. The laser-termination bead 32 is preferably an epoxy such as HYSOL 1C-LV, manufactured by Dexter Polymer Systems, Seabrook, N.H. Hysol 1C-LV epoxy does not require elevated cure temperatures, and is non-conductive.

The process of the present invention comprises first laying down a precise laser-termination bead separating what will be the uncoated region (which in a preferred embodiment is everything outboard of bead 32 between the bead and the panel edge 33) from what will be the coated region (everything inboard of bead 32).

Protective adhesive tape 30 may be placed over any areas to be protected in the future uncoated region (i.e. wirebonding pads 16). The steps of applying the bead and taping the protected region may be practiced in any sequence. The tape may extend past the panel edge 33 so that in addition to protecting the wirebonding pads, the tape provides an easily graspable edge for a later step of peeling it and any attached polymer layers away.

Next, one or more layers of the dielectric coating 20, are applied over the panel, including over the laser-termination bead and, if present, the protective tape 30, as better shown in the schematic elevation FIG. 4. In the preferred embodiment, two dielectric layers 20 and 26 are applied with a chrome layer 28 applied between them. Using a laser 34, such as an excimer laser, the parylene is then cut by the laser beam 35 along the laser-termination bead 32. The protective tape 30 over the wirebonding pads 16 is next removed by peeling away, taking the parylene layer or layers with it.

Figure 5:
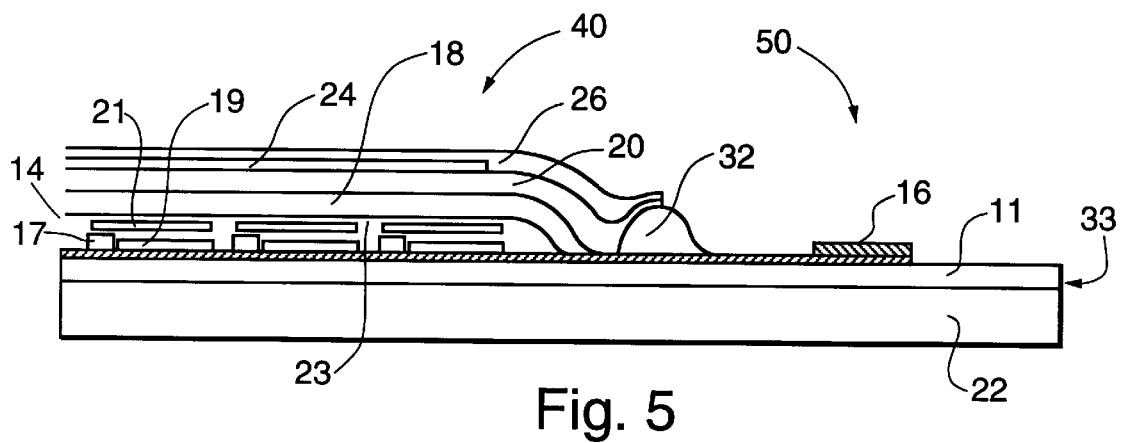
FIG. 5 is a schematic sectional view illustration of the area of the panel shown in FIG. 4 after the dielectric layer has been cut and removed therefrom.

Referring now to FIG. 5, there is shown an edge portion of the resulting panel after the designated section of parylene has been removed. The panel has a coated area 40 inboard of bead 32 and an uncoated area 50 outboard of bead 32, with the bead itself being approximately half coated and half uncoated.

The deposition of the termination bead 32 and the laser cutting operation is done using equipment developed to provide the high level of accuracy required to place the bead at the proper position, and then, following curing of the bead and coating of the panel with the dielectric layer, to permit repositioning the panel in the proper orientation and to accurately follow the beam top with the cutting laser beam.

Figure 6:
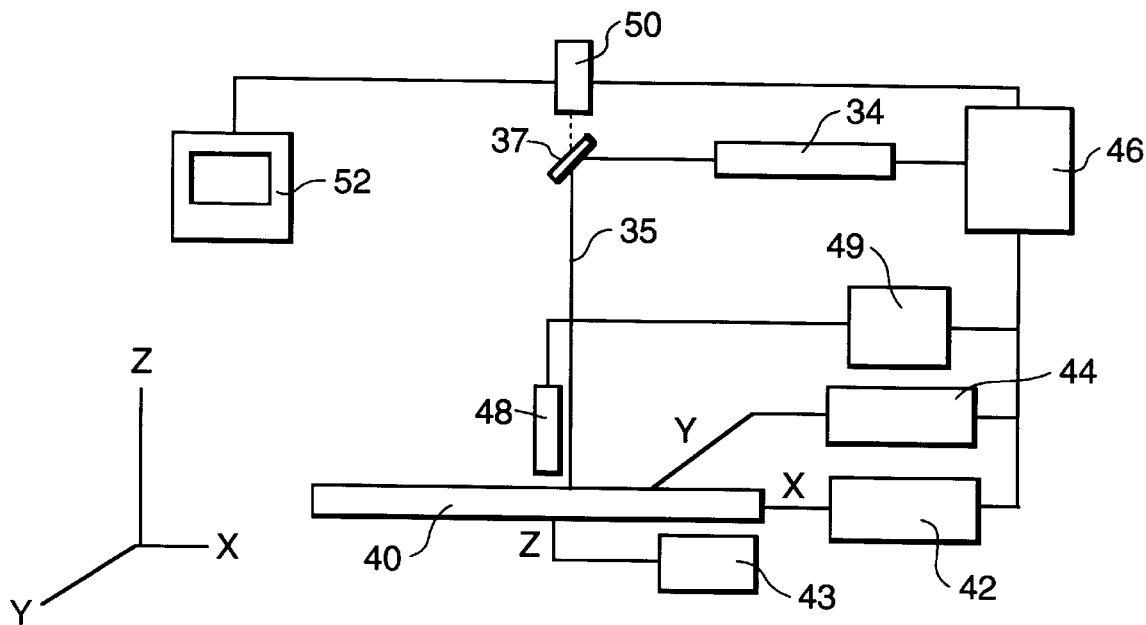
FIG. 6 is a schematic diagram representing equipment useful in implementing this invention.

FIG. 6 illustrates the basic attributes of this equipment. While a single piece of equipment is illustrated able to perform both the beam laying function and the subsequent laser cutting operation, two separate units may be used, one dedicated to the beam laying operation the second to the dielectric laser cutting step.

In its most basic form, the equipment for applying the bead includes a supporting stage 40 which is linearly moveable in the X, Y, and Z direction and can also be rotated in the x-y plane. The base lies in the X-Y plane. Electric linear step motors 42, 43 and 44 provide the translation movement while another motor not shown provides the rotational motion. Highly accurate motors together with associated electronic controllers which receive commands from an appropriately programmed computer 46 are known in the art and are used to drive the base and a panel mounted thereon under a fixed bead dispenser 48 (described below) for the bead deposition. Preferably the equipment also includes a video targeting camera 50 which views the panel from above along the Z axis. The video output is magnified and displayed on a monitor 52. The arrangement of the camera is such that a detail magnified image of a portion of the panel may be viewed from directly above. Furthermore, the camera permits viewing the panel as the panel is translated under the camera and the bead dispenser, from one end of the panel to the other.

Closely associated with the camera is the bead dispenser 48. This dispenser is fixedly attached to a rigid support of the equipment and is offset from the camera viewing axis by a known fixed distance along one of the panel translation axis (i.e. the X axis).

As mentioned above, the preferred material for the bead is an epoxy. Typically an epoxy is provided in two parts which are mixed prior to use. This creates a window of time in which to apply the bead before the epoxy becomes too viscous for dispensing. In case where he epoxy is the aforementioned HYSOL 1C-LV, this window is about two minutes following mixing of the two parts. It is therefore important to rapidly apply the bead in a continuous manner at the exact location as determined by the video camera to assure the deposition of a highly uniform bead particularly along the Z axis. To help achieve this highly precise bead deposition the dispenser 48 includes a source 49 of compressed air which is used to force uncured bead material in a continuous smooth flow through a preferably disposable mixed epoxy container 60.

Figure 7:
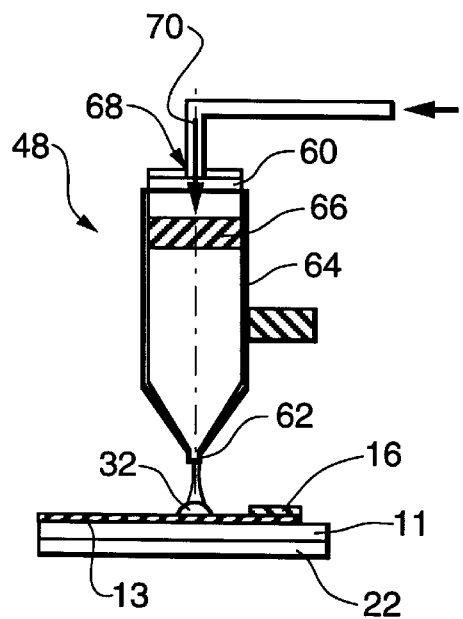
FIG. 7 is a schematic detail representation of the dispenser arrangement for dispensing the bead according to this invention.

The essential elements of the bead dispenser are shown in FIG. 7. The two part epoxy is mixed in a small, plastic, disposable cylindrical container 60 which terminates in a cone at one end. The cone terminates in a small diameter cylindrical dispensing nozzle 62. Because the nozzle is quite thin and is easily bent, it is possible that during the positioning of the dispenser container to knock the nozzle out of alignment with the axis of the dispenser. To prevent this, the container 60 is placed in a permanently affixed and aligned steel receptacle 64 having a complementary shape to that of the dispenser container 60 and sized to receive the container 60 and to locate the dispenser nozzle 62 repeatedly in the same position relative to the dispenser axis.

A cylindrical plug 66 is placed on top of the mixed epoxy in the dispenser container 60 and a cap 68 adapted to connect to the pressurized air supply source 49, is attached to the dispenser top enclosing the dispenser. The cap is connected to the pressurized air source through piping 70 and pressurized air is used to push the plug downwardly to dispense a bead of epoxy onto a panel placed thereunder.

Each panel contains special alignment markings or fiducials which are used to properly align the panel with respect to the bead dispenser. A panel is placed on the base and roughly aligned with the x-y axes using preset stops on the base. Preferably the panel is held securely on the base using vacuum hold down. Vacuum hold down (which comprises the application of a suction force to the underside of a flat surface through a plurality of regularly distributed orifices in the base) is well known in the art and needs no further elaboration here.

Before applying the bead, the magnifying targeting camera 50 is used to detect the fiducials on either end of the panel. A rotation compensation is then performed to accurately align the panel to the XY stages. Knowing the constant camera-to-dispenser tip offset, and all other panel features relative to the fiducials, incremental moves of the panel in 3 axes and any required rotation the panel, are then programmed in the control computer to drive the panel along a predetermined path under the bead dispenser to generate the required bead geometry around the panel.

Once the path has been programmed, the epoxy is mixed and placed in the dispenser 60. The dispenser 60 is mounted in the receptacle 64 and the air source connected to the dispenser. The panel is then transported according to the programmed path under the dispenser nozzle 62 at a rate such that the dispensing process terminates before the epoxy sets. The speed of translation of the panel and the pressure applied to the dispenser control the size of the deposited bead.

After the bead is dispensed, the panel is removed from the base and the bead is allowed to cure at room temperature before the dielectric or any other layers are deposited on top.

Prior to the deposition of the dielectric layer, an individual panel may be "mapped" in 3 dimensions relative to X critical surface features such as the panel edges, fiducials, and the boundaries of the region where the dielectric layer is desired. This mapping data may be used for statistical process control and stored in a database.

Surface mapping is particularly useful for use with lasers having a beam with a shallow depth of focus. Height irregularities of the dielectric layer which follows the surface of electronic or other components on the panel surface may exceed the laser depth of focus resulting in incomplete cutting of the dielectric layer due to insufficient focused laser beam penetration. Mapping of the surface either during the bead application or later, prior to the cutting operation can be used to follow the surface contours with the laser beam.

The mapping may be done on a computer-controlled, precision XYZ table which may be fitted with robotic quick disconnect tooling, a magnifying targeting camera, and an optical Z-axis displacement transducer. This can be the same table used for holding the panel in the apparatus used for dispensing the bead, by fitting a Z axis position transducer. It may be a separate, dedicated work station or, if a separate laser cutting station is used, the panel holding table used in the laser cutting instrument. However, if the panel height and flatness as well as the laser beam depth of field, i.e. the cutting length of the focused beam, are such that any irregularities in the panel surface height are small enough to fall within the laser cutting depth, such Z-axis mapping is unnecessary.

The laser used for the cutting operation may use the same base and alignment facilities as the bead dispensing equipment, or may be a completely separate apparatus. Whatever the arrangement, alignment of the panel is again essential since the panel has been removed from the base following the application of the bead, for the application of the dielectric coating.

Again in its basic form, the laser cutter will include a high power laser 34 and appropriate control electronics 46, which again preferably include a computer. When the cutting and dispensing apparatus is a single unit a single computer may be used. If the two are separate units individual control computers will most probably be used. In such case networking of the two control computers is preferred.

Preferably, as illustrated the laser beam is focused and directed through a 45° reflector 37 onto a panel placed on the base 40. Camera 50, which may be the same camera used in aligning the panel during the bead dispensing step may be used for viewing the cutting beam through the reflector 37 by selecting a coated reflector that permits viewing through it the laser beam incident on the bead. The camera viewing axis is thus coincident with the cutting beam 35.

In one embodiment, laser 34 is operable at two power levels, one being at substantially reduced power so that no cutting of the dielectric occurs. This lower level exposure may be used to perform a trial run in which the laser beam track on the dielectric is observed through the camera to determine that the panel alignment is such that the laser beam stays on the bead. If this is not so the X-Y position and rotational orientation of the panel may be corrected to bring the beam and bead into the proper alignment during the translation of the panel.

In an alternate embodiment, the magnifying camera 50, that is co-linear with the laser beam, allows an operator to confirm bead and beam paths before firing the cutting laser on the panel, by inspecting the bead while traversing the camera along the cutting path with the laser beam off.

The laser operating parameters are chosen to allow penetration of an equivalent dielectric thickness greater than the actual thickness. For instance, the laser may be set to cut parylene having 125% the thickness of the actual coating layer or layers to be cut. This magnitude of laser energy ensures the parylene is completely cut so that the section slated for removal can be easily peeled away. The laser-termination bead harmlessly absorbs the excess laser energy.

In a preferred arrangement wherein the laser optics are configured to yield a cutting beam having a cross section 0.060 mm wide by 1.8 mm long, the excimer laser can remove 0.0002 mm–0.0004 mm of parylene per pulse. In one embodiment, where the laser is operated at 100 Hz frequency the completion of the 62 inch long cut along a 14×17 panel discussed earlier is accomplished in 35 minutes.

Those skilled in the art, having the benefit of the teachings of the present invention as hereinabove set forth, can effect numerous modifications thereto. These modifications are to be construed as being encompassed within the scope of the present invention as set forth in the appended claims where the following is claimed:

What is claimed is:

1. A process for selectively removing a dielectric layer from a portion of a panel to create a coated and an uncoated region, the process comprising:

a) applying a laser-termination bead on said panel to separate a first region corresponding to the coated region from a second region corresponding to the uncoated region;

b) applying a dielectric layer over said panel and said laser-termination bead;

c) cutting said dielectric layer along said laser-termination bead by traversing said dielectric layer on said laser-termination bead with a laser beam; and d) removing said dielectric layer over said second region.

2. The process according to claim 1 wherein said dielectric layer comprises a polymer layer.

3. The process according to claim 1 wherein said dielectric layer comprises parylene.

4. The process according to claim 1 wherein the panel further comprises an edge and a sensitive area in the second region, and wherein, following step (a) and prior to step (b), the process further comprises applying a masking tape over the sensitive area, said masking tape extending beyond the panel edge, and in step (b) also applying the dielectric layer over the masking tape.

5. The process according to claim 4 wherein the cutting step comprises cutting the dielectric layer along said laser-termination bead with an excimer laser.

6. The process according to claim 4 wherein step (c) comprises cutting said dielectric layer with a laser emitting ultraviolet light having a wavelength of less than 300 nm.

7. The process according to claim 4 wherein said dielectric layer has a thickness and the laser used in step (c) has an energy level sufficient to cut 125% of the dielectric layer thickness.

8. A process for selectively removing a dielectric layer from a desired region including sensitive areas, of a direct radiography radiation detection panel having radiation sensors, a radiation-detecting layer thereover, wirebonding pads and an edge, the process comprising:

a) applying a laser termination bead comprising an epoxy to separate the desired region from the remaining panel and allowing said epoxy bead to cure;

b) applying a first dielectric layer over said panel, including over said radiation-detecting layer, said laser-termination bead and said wirebonding pads;

c) depositing a conductive layer over said first dielectric layer in an area that is above said sensors;

d) applying a second dielectric layer over said conductive layer;

e) aligning said laser-termination bead along a laser cutting path; and simultaneously cutting said first and second dielectric layers along said laser cutting path by traversing a cutting laser beam along the cutting path.

9. The process according to claim 8 wherein the dielectric layer comprises parylene.

10. The process according to claim 8 further comprising prior to applying the first dielectric layer, applying a masking tape over said sensitive areas in said desired region.

11. The process according to claim 10 wherein the aligning step (e) comprises traversing a non-cutting laser beam along the cutting path and observing a trace of said non-cutting laser beam on said laser-termination bead.

12. The process according to claim 9 further comprising following step (f) simultaneously removing said first and second dielectric layers from over said sensitive areas along with said tape by peeling away said masking.

13. The process according to claim 10 wherein step (e) is performed using a single laser.

14. The process according to claim 10 wherein the sensitive areas comprise the wirebonding pads.

15. The process according to claim 10 wherein step (f) comprises cutting said parylene layer with a laser emitting ultraviolet light having a wavelength of less than 300 nm.

16. The process according to claim 10 wherein said first and second parylene layers have a combined thickness and step (f) further comprises using a laser beam having sufficient energy to enable a cutting penetration depth of about 125% of said combined thickness.

17. The process according to claim 15 wherein step (f) further comprises configuring said laser to yield a beam having dimensions of about 0.060 mm wide by about 1.8 mm long.

18. The process according to claim 17 wherein step (f) further comprises operating said laser at a frequency of about 100 Hz.

* * * * *